US 12,057,512 B2

(12) United States Patent
Ueno et al.

(10) Patent No.: US 12,057,512 B2
(45) Date of Patent: Aug. 6, 2024

(54) SEMICONDUCTOR DEVICE

(71) Applicant: ROHM CO., LTD., Kyoto (JP)

(72) Inventors: Masaya Ueno, Kyoto (JP); Sawa Haruyama, Kyoto (JP); Masaya Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 111 days.

(21) Appl. No.: 17/711,819

(22) Filed: Apr. 1, 2022

(65) Prior Publication Data
US 2022/0320349 A1 Oct. 6, 2022

(30) Foreign Application Priority Data
Apr. 5, 2021 (JP) .................. 2021-064149

(51) Int. Cl.
*H01L 29/47* (2006.01)
*H01L 23/00* (2006.01)
*H01L 29/06* (2006.01)
*H01L 29/872* (2006.01)
*H01L 29/16* (2006.01)

(52) U.S. Cl.
CPC ............ *H01L 29/872* (2013.01); *H01L 24/05* (2013.01); *H01L 29/0692* (2013.01); *H01L 29/47* (2013.01); *H01L 29/0619* (2013.01); H01L 29/1608 (2013.01); H01L 2224/05624 (2013.01); H01L 2224/05638 (2013.01); H01L 2224/05647 (2013.01); *H01L 2924/0132* (2013.01); *H01L 2924/0133* (2013.01)

(58) Field of Classification Search
CPC . H01L 29/0619; H01L 29/0692; H01L 29/47; H01L 29/872
USPC ........................................................ 257/484
See application file for complete search history.

(56) References Cited

U.S. PATENT DOCUMENTS 6,806,548 B2 * 10/2004 Shirai ................... H01L 29/20
257/334

FOREIGN PATENT DOCUMENTS

JP 2008-282972 A 11/2008

* cited by examiner

*Primary Examiner* — Monica D Harrison
(74) *Attorney, Agent, or Firm* — XSENSUS LLP

(57) ABSTRACT

A semiconductor device includes: a semiconductor layer including a semiconductor substrate and an epitaxial layer of a first conductivity type formed on the semiconductor substrate; a surface electrode containing at least one selected from the group consisting of an aluminum alloy and aluminum and formed on the semiconductor layer; and an impurity region of a second conductivity type formed on a surface layer portion of the epitaxial layer and forming a pn junction with the epitaxial layer, wherein the surface electrode includes a Schottky portion that is in contact with a surface of the semiconductor layer and forms a Schottky junction with the epitaxial layer.

14 Claims, 21 Drawing Sheets

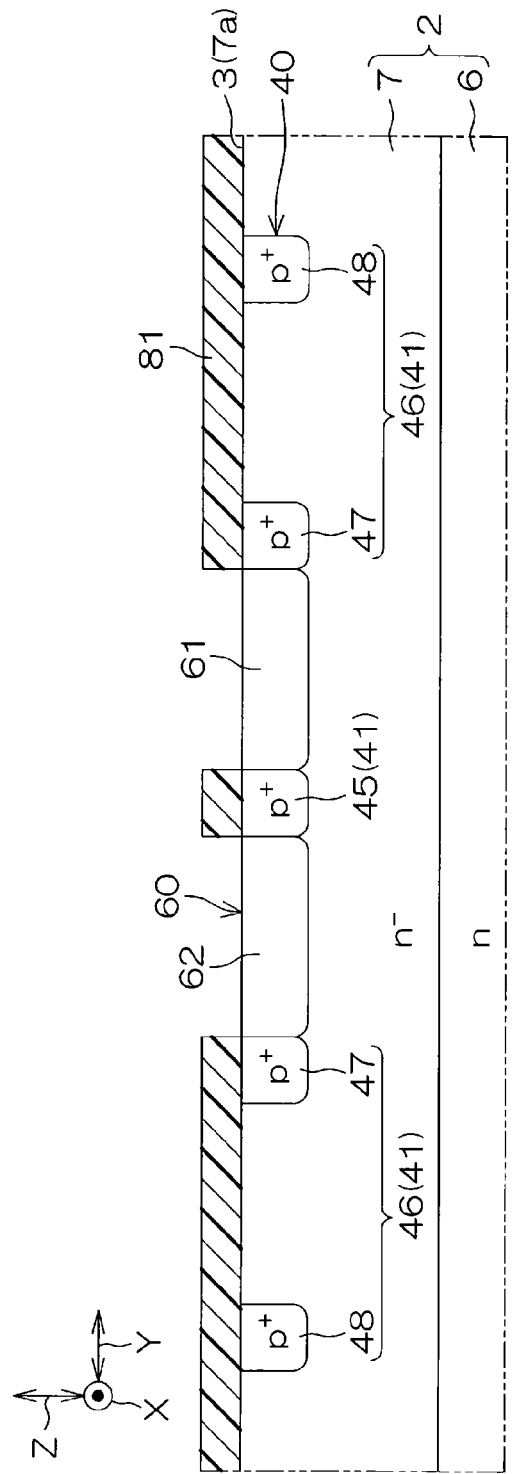

SEMICONDUCTOR DEVICE

CROSS-REFERENCE TO RELATED APPLICATION

This application is based upon and claims the benefit of priority from Japanese Patent Application No. 2021-064149, filed on Apr. 5, 2021, the entire contents of which are incorporated herein by reference.

TECHNICAL FIELD

The present disclosure relates to a semiconductor device including a Schottky barrier diode.

BACKGROUND

In the related art, there is known a configuration in which an upper electrode composed of molybdenum (Mo) or titanium (Ti) makes Schottky contact with a drift layer.

SUMMARY

With the power saving of a semiconductor device, it is required to reduce a forward voltage of a Schottky barrier diode. Therefore, some embodiments of the present disclosure provide a semiconductor device capable of reducing a forward voltage in a configuration having a Schottky junction.

A semiconductor device according to the present disclosure includes: a semiconductor layer including a semiconductor substrate and an epitaxial layer of a first conductivity type formed on the semiconductor substrate; a surface electrode containing at least one selected from the group consisting of an aluminum alloy and aluminum and formed on the semiconductor layer; and an impurity region of a second conductivity type formed on a surface layer portion of the epitaxial layer and forming a pn junction with the epitaxial layer, wherein the surface electrode includes a Schottky portion that is in contact with a surface of the semiconductor layer and forms a Schottky junction with the epitaxial layer.

BRIEF DESCRIPTION OF DRAWINGS

The accompanying drawings, which are incorporated in and constitute a part of the specification, illustrate embodiments of the present disclosure.

FIG. 18C is a schematic view for explaining how the impurity region and the lattice defect region are formed.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
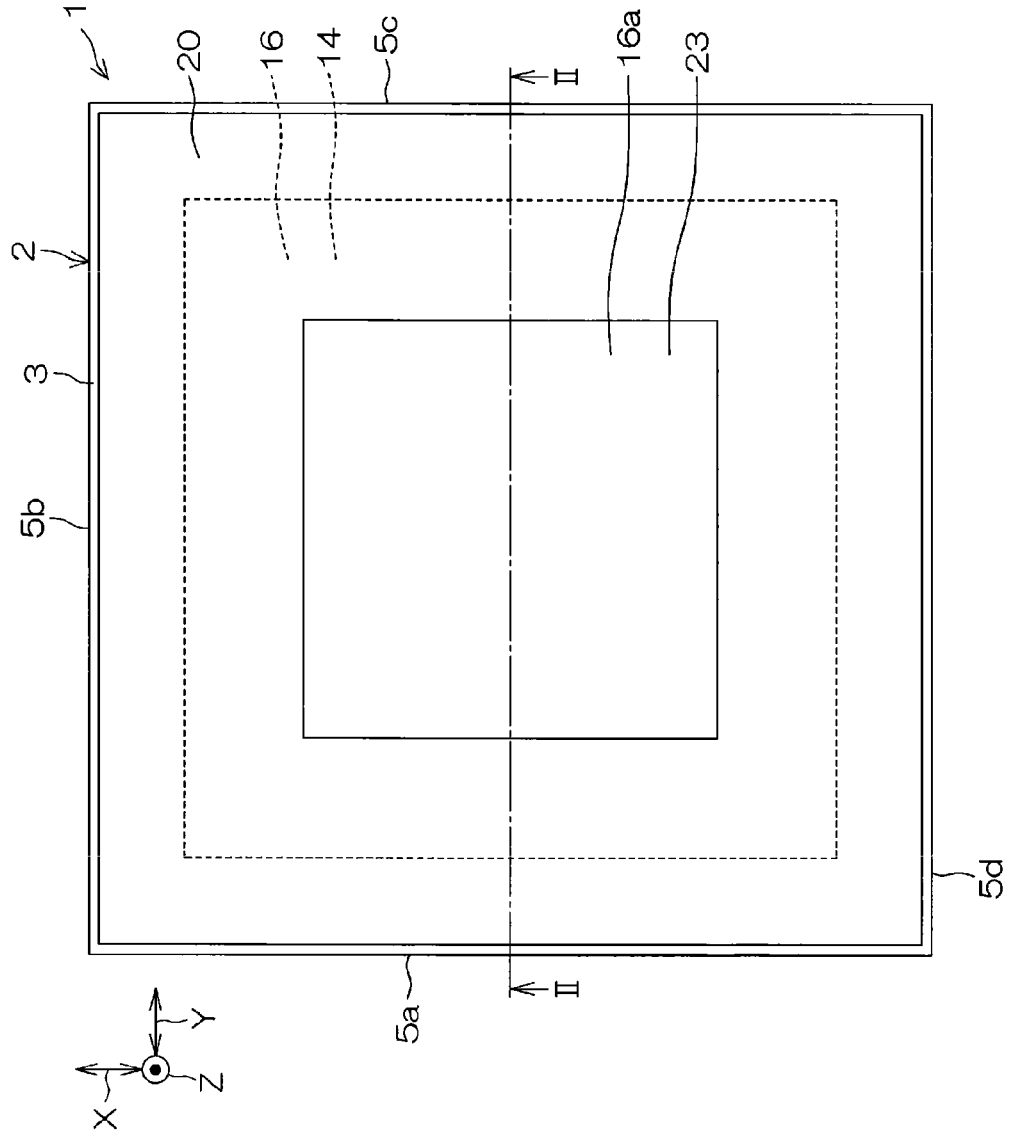
FIG. 1 is a plan view of a main part of a Schottky barrier diode according to a first embodiment.
Figure 2:
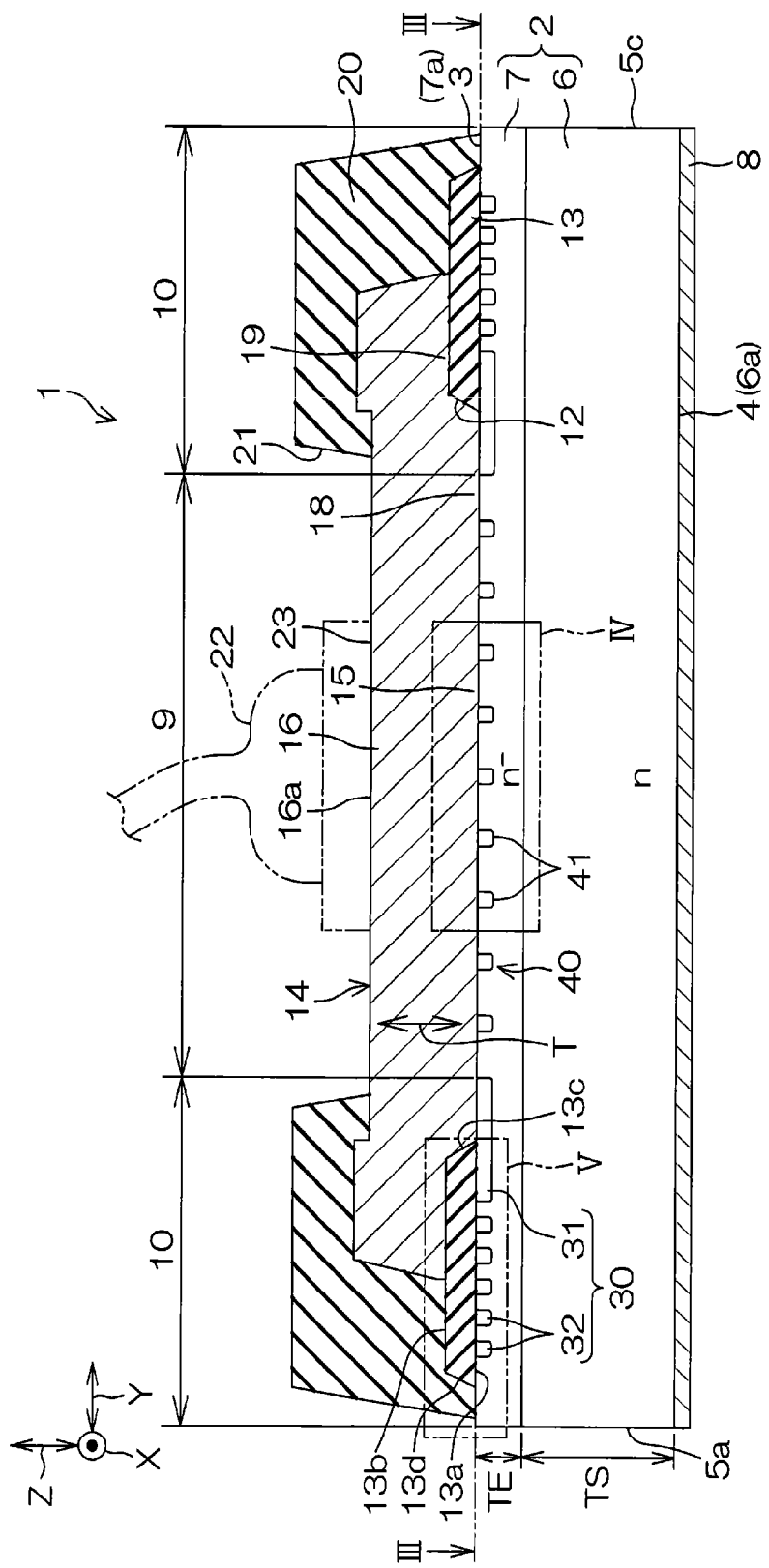
FIG. 2 is a cross-sectional view taken along line II-II shown in FIG. 1.
Figure 3:
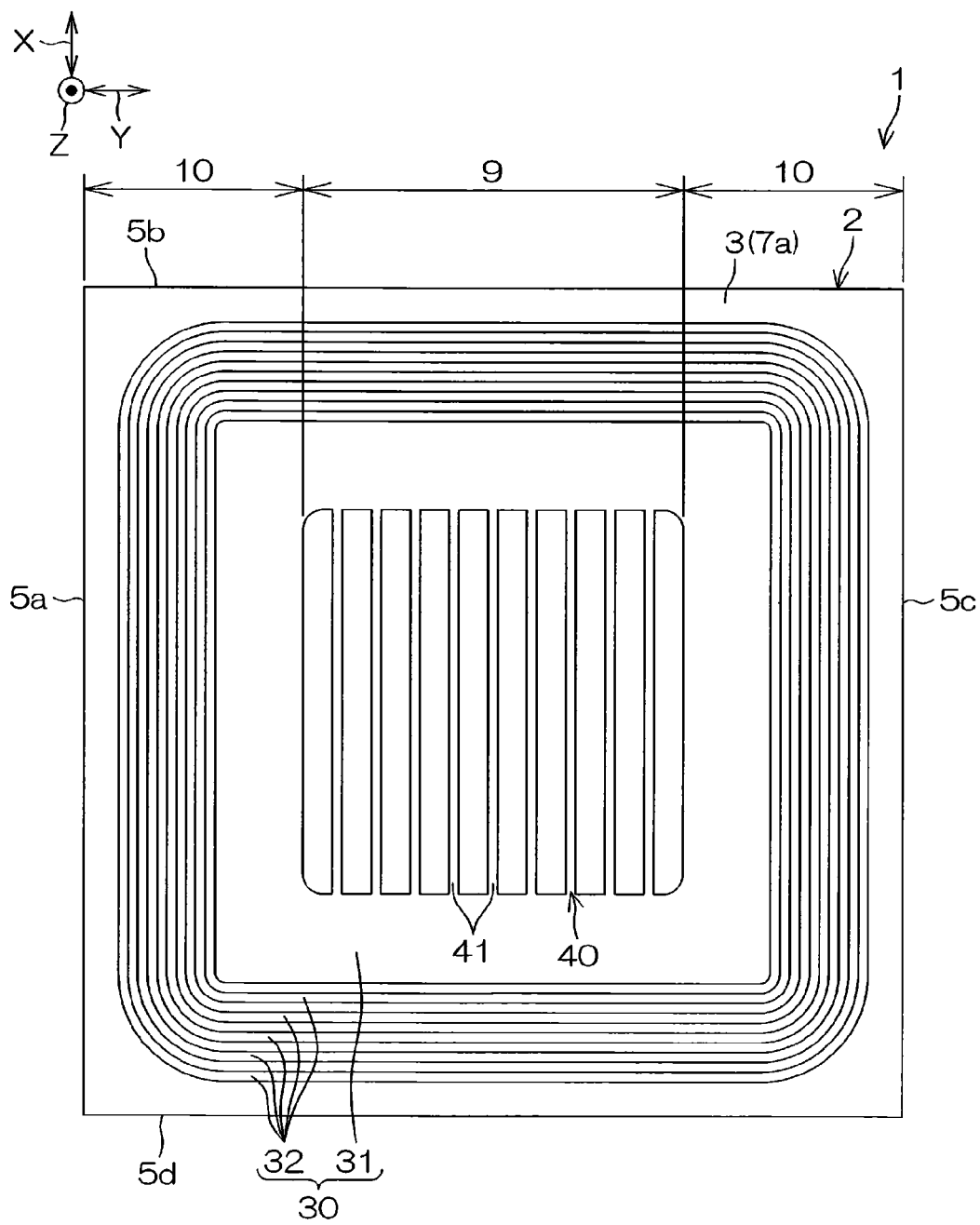
FIG. 3 is a cross-sectional view taken along line III-III shown in FIG. 2.
Figure 4:
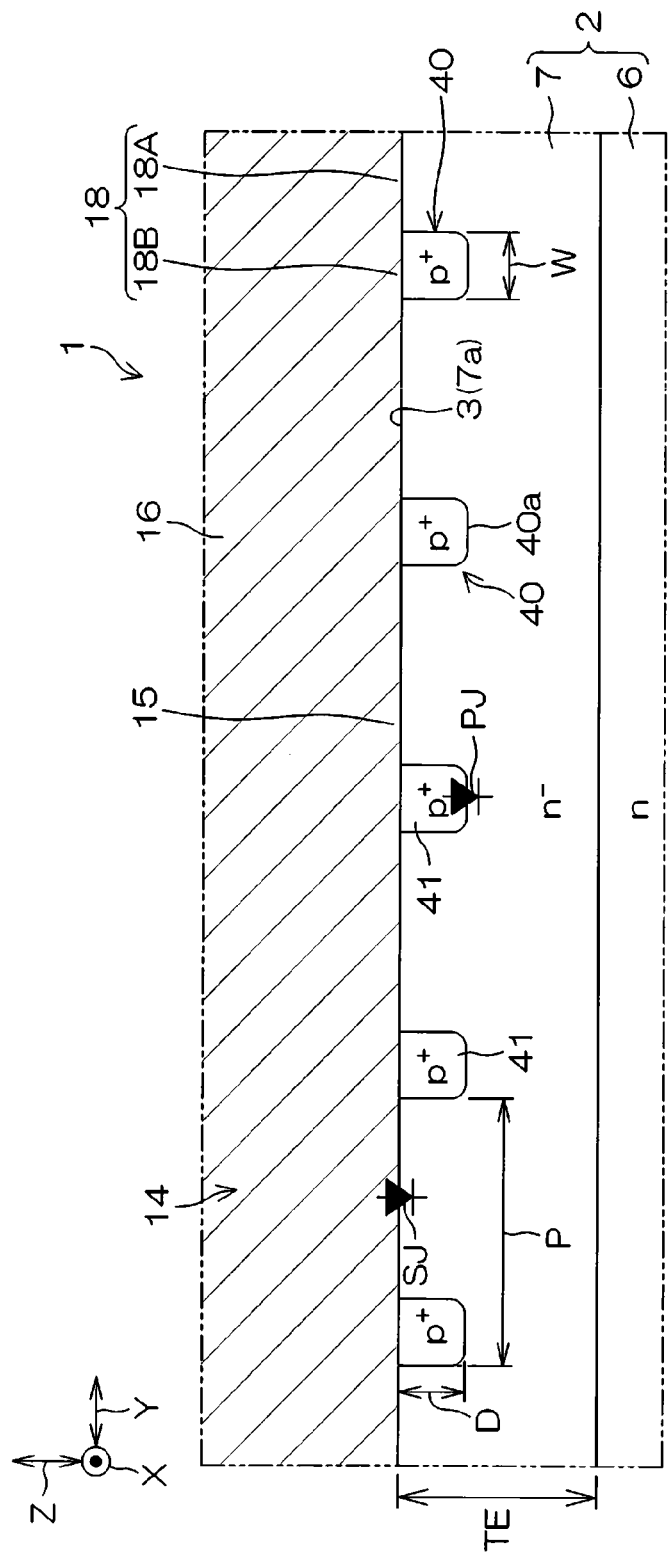
FIG. 4 is an enlarged view of region IV shown in FIG. 2.
Figure 5:
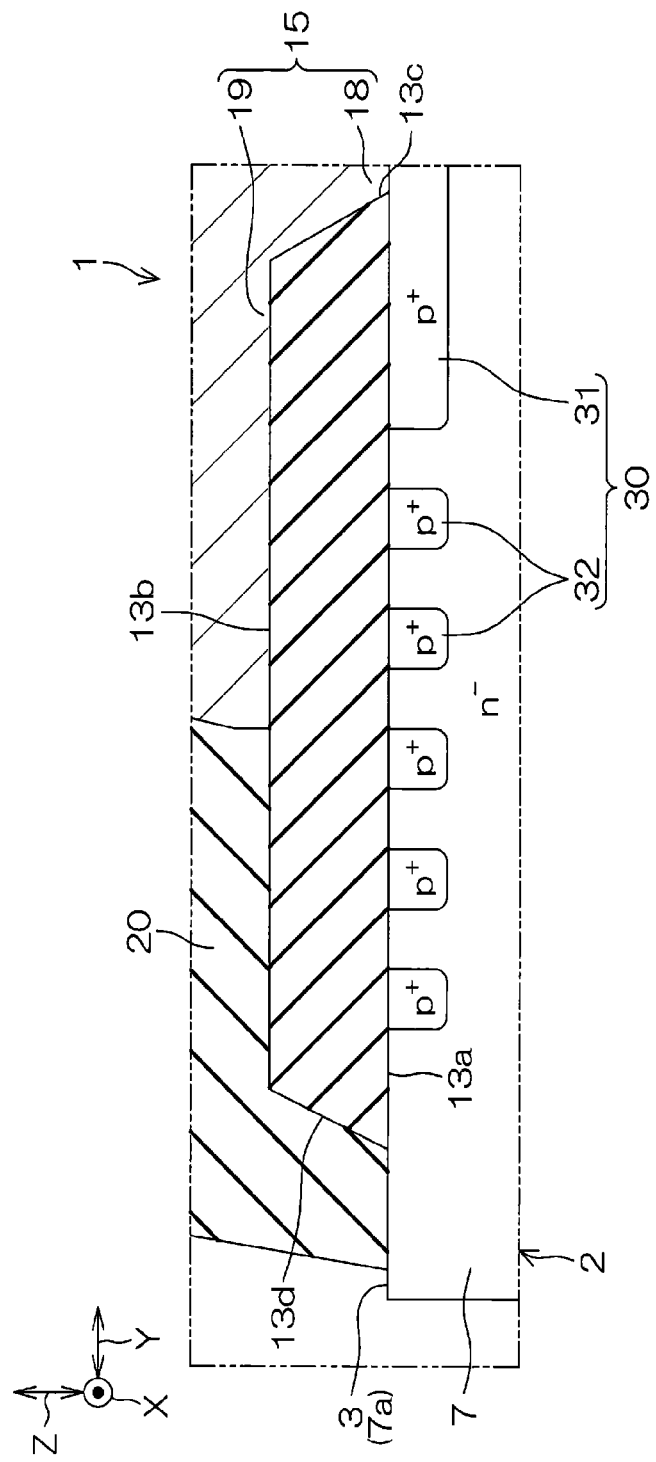
FIG. 5 is an enlarged view of region V shown in FIG. 2.

FIG. 1 is a plan view of a main part of a Schottky barrier diode 1 as a semiconductor device according to a first embodiment. FIG. 2 is a cross-sectional view taken along line II-II shown in FIG. 1. FIG. 3 is a cross-sectional view taken along line III-III shown in FIG. 2. FIG. 4 is an enlarged view of region IV shown in FIG. 2. FIG. 5 is an enlarged view of region V shown in FIG. 2.

A configuration of the Schottky barrier diode 1 will now be described with reference to FIGS. 1 to 5.

Referring to FIG. 1, the Schottky barrier diode 1 is a Schottky barrier diode adopted with 4H-SiC (a wide band gap semiconductor having an insulation breakdown electric field of about 2.8 MV/cm and a band gap width of about 3.26 eV), and has, for example, a square chip shape in a plan view. A length of each side of the chip-shaped Schottky barrier diode 1 is 0.5 mm to 20 mm. That is, a chip size of the Schottky barrier diode 1 is, for example, 0.25 mm$^2$ to 400 mm$^2$.

The Schottky barrier diode 1 includes a semiconductor layer 2 made of SiC and formed in a shape of a rectangular parallelepiped chip. An off angle of the semiconductor layer 2 is desirably 4 degrees or less. The semiconductor layer 2 has a first main surface 3 on one side thereof, a second main surface 4 on the other side thereof (see FIG. 2), and side surfaces 5a, 5b, 5c, and 5d connecting the first main surface 3 and the second main surface 4. The first main surface 3 and the second main surface 4 are formed in a quadrilateral shape (a square shape in this embodiment) in a plan view viewed from their normal direction Z (hereinafter, simply referred to as "in a plan view").

In this embodiment, the side surface 5a and the side surface 5c extend along a first direction X and face each other in a second direction Y intersecting the first direction X. In this embodiment, the side surface 5b and the side surface 5d extend along the second direction Y and face each other in the first direction X. More specifically, the second direction Y is a direction orthogonal to the first direction X.

Referring to FIG. 2, in this embodiment, the semiconductor layer 2 has a stacked structure including a semiconductor substrate 6 made of n-type (first conductivity type) SiC and an epitaxial layer 7 made of n-type SiC. The semiconductor substrate 6 forms the second main surface 4 of the semiconductor layer 2, and the epitaxial layer 7 forms the first main surface 3 of the semiconductor layer 2. The first main surface 3 is a surface 7a of the epitaxial layer 7 on the opposite side to the semiconductor substrate 6, and the second main surface 4 of the semiconductor layer 2 is a surface 6a of the semiconductor substrate 6 on the opposite side to the epitaxial layer 7. As n-type impurities, for example, N (nitrogen), P (phosphorus), As (arsenic), and the like are used.

The Schottky barrier diode 1 further includes a cathode electrode 8 as an ohmic electrode formed so as to cover the entire second main surface 4 of the semiconductor layer 2 (the surface 6a of the semiconductor substrate 6). The cathode electrode 8 is made of metal that ohmically bonds to the n-type SiC. Examples of the metal that ohmically bonds to the n-type SiC may include Ti/Ni/Ag and Ti/Ni/Au/Ag.

A thickness TS of the semiconductor substrate 6 may be 40 μm or more and 150 μm or less. The thickness TS may be 40 μm or more and 50 μm or less, 50 μm or more and 60 μm or less, 60 μm or more and 70 μm or less, 70 μm or more and 80 μm or less, 80 μm or more and 90 μm or less, 90 μm or more and 100 μm or less, 100 μm or more and 110 μm or less, 110 μm or more and 120 μm or less, 120 μm or more and 130 μm or less, 130 μm or more and 140 μm or less, or 140 μm or more and 150 μm or less. The thickness TS is desirably 40 μm or more and 130 μm or less.

A thickness TE of the epitaxial layer 7 may be 1 μm or more and 50 μm or less. The thickness TE may be 1 μm or more and 5 μm or less, 5 μm or more and 10 μm or less, 10 μm or more and 15 μm or less, 15 μm or more and 20 μm or less, 20 μm or more and 25 μm or less, 25 μm or more and 30 μm or less, 30 μm or more and 35 μm or less, 35 μm or more and 40 μm or less, 40 μm or more and 45 μm or less, 45 μm or more and 50 μm or less. The thickness TE is desirably 5 μm or more and 15 μm or less.

A concentration of n-type impurities in the epitaxial layer 7 is equal to or less than a concentration of n-type impurities in the semiconductor substrate 6. More specifically, the concentration of n-type impurities in the epitaxial layer 7 is less than the concentration of n-type impurities in the semiconductor substrate 6. The concentration of n-type impurities in the semiconductor substrate 6 may be $1.0 \times 10^{18}$ $cm^{-3}$ or more and $1.0 \times 10^{21}$ $cm^{-3}$ or less. The concentration of n-type impurities in the epitaxial layer 7 may be $1.0 \times 10^{15}$ $cm^{-3}$ or more and $1.0 \times 10^{18}$ $cm^{-3}$ or less.

An active region 9 and an inactive region 10 are set on the first main surface 3 of the semiconductor layer 2 (the surface 7a of the epitaxial layer 7). In a plan view, the active region 9 is set in a central portion of the first main surface 3 of the semiconductor layer 2, that is, in a region inward of the side surfaces 5a to 5d of the semiconductor layer 2 with a gap from the side surfaces 5a to 5d of the semiconductor layer 2. In a plan view, the active region 9 is set to have a quadrilateral shape having four sides parallel to the side surfaces 5a to 5d of the semiconductor layer 2, respectively.

The inactive region 10 is set between the side surfaces 5a to 5d of the semiconductor layer 2 and a peripheral edge of the active region 9. In a plan view, the inactive region 10 is set to have an endless shape (a quadrangle annular shape in this embodiment) surrounding the active region 9.

The Schottky barrier diode 1 further includes a p-type (second conductivity type) guard region 30 formed on a surface layer portion of the first main surface 3 of the semiconductor layer 2 (a surface layer portion of the surface 7a of the epitaxial layer 7) in the inactive region 10.

As shown in FIG. 3, the guard region 30 is formed in an endless shape (for example, a quadrangle annular shape, a quadrangle annular shape with chamfered corners, or an annular shape) surrounding the active region 9 in a plan view. As a result, the guard region 30 is formed as a guard ring region. In this embodiment, the active region 9 is defined by an inner end of the guard region 30.

The guard region 30 includes a wide first guard region 31 and a plurality of (five in the example of FIG. 3) second guard regions 32 that surround the first guard region 31 and are narrower than the first guard region 31. The second guard regions 32 are provided at equal intervals. Unlike the example of FIG. 3, the guard region 30 may be composed of a single endless region (for example, a quadrangle annular shape, a quadrangle annular shape with chamfered corners, or an annular shape).

Referring to FIG. 2, the Schottky barrier diode 1 further includes an annular field insulating film 13 as an interlayer insulating film formed on the first main surface 3 of the semiconductor layer 2. The field insulating film 13 covers a portion of the first main surface 3 of the semiconductor layer 2 in the inactive region 10. The field insulating film 13 has an opening 12 that exposes a portion of the first main surface 3 of the semiconductor layer 2.

An active size of the active region 9 is, for example, 0.1 $mm^2$ or more and 400 $mm^2$ or less. The field insulating film 13 may have, for example, a single-layer structure composed of a silicon oxide ($SiO_2$) layer or a silicon nitride (SiN) layer. A thickness of the field insulating film 13 is, for example, 0.5 μm or more and 3 μm or less.

The field insulating film 13 has a first surface 13a in contact with the first main surface 3, a second surface 13b on the opposite side of the first surface 13a, and an inner side surface 13c and an outer side surface 13d that connect the first surface 13a and the second surface 13b. The inner side surface 13c is an inclined surface that is inclined so as to form an acute angle inside the field insulating film 13 between the inner side surface 13c and the first main surface 3. The outer side surface 13d is an inclined surface that is inclined so as to form an acute angle inside the field insulating film 13 between the outer side surface 13d and the first main surface 3.

The Schottky barrier diode 1 further includes an anode electrode 14 as a surface electrode formed on the first main surface 3 of the semiconductor layer 2 by using at least one selected from the group consisting of an aluminum alloy and aluminum. The aluminum alloy is, for example, one of an AlSi alloy, an AlCu alloy, and an AlSiCu alloy. The anode electrode 14 is not necessarily formed of the aluminum alloy and aluminum only, and may contain a small amount of other components as impurities.

Referring to FIGS. 2 and 4, the anode electrode 14 includes a Schottky portion 15, which is formed on the first main surface 3 of the semiconductor layer 2 and forms a Schottky junction SJ with the semiconductor layer 2 (the epitaxial layer 7), and a connecting portion 16 having a surface 16a to which a connecting member 22 such as a bonding wire is connected. The Schottky portion 15 and the connecting portion 16 form a single-layer structure made of the same substance. The Schottky junction SJ is formed in a vicinity of a contact interface between the Schottky portion 15 and the epitaxial layer 7.

The Schottky portion 15 includes a first covering portion 18 that covers the first main surface 3 of the semiconductor layer 2 in the active region 9, and a second covering portion 19 that covers the field insulating film 13. The second covering portion 19 covers the entire inner side surface 13c of the field insulating film 13 and a portion of the second surface 13b. Therefore, the field insulating film 13 is arranged between the first main surface 3 of the semiconductor layer 2 and the Schottky portion 15.

The first guard region 31 is in contact with the Schottky portion 15 and the field insulating film 13, and the second guard regions 32 are in contact with the field insulating film 13 (see FIG. 5).

The Schottky barrier diode 1 further includes a passivation layer 20 as an insulating layer formed on the connecting portion 16 of the anode electrode 14. The passivation layer 20 may have a single-layer structure composed of a silicon oxide layer or a silicon nitride layer, or may have a stacked structure composed of a silicon oxide layer and a silicon nitride layer. When the passivation layer 20 has the stacked structure, the silicon oxide layer may be formed on the silicon nitride layer, or the silicon nitride layer may be formed on the silicon oxide layer. In this embodiment, the passivation layer 20 has a single-layer structure composed of a silicon nitride layer.

In a plan view, the passivation layer 20 is formed in a region inward of the side surfaces 5a to 5d of the semiconductor layer 2 with a gap from the side surfaces 5a to 5d of the semiconductor layer 2. The passivation layer 20 has a sub-pad opening 21 that exposes a portion of the surface 16a of the connecting portion 16 of the anode electrode 14 as a connecting region 23 with the connecting member 22. The connecting member 22 is connected to the connecting region 23 from a thickness direction T of the anode electrode 14.

The Schottky barrier diode 1 further includes a p-type (second conductivity type) impurity region 40 formed on the surface layer portion of the first main surface 3 (the surface 7a of the epitaxial layer 7) of the semiconductor layer 2 in the active region 9 so as to be in contact with the Schottky portion 15. The impurity region 40 forms a pn junction PJ with the epitaxial layer 7 of the semiconductor layer 2. The pn junction PJ is formed in a vicinity of a contact interface between the impurity region 40 and the epitaxial layer 7.

Referring to FIG. 3, the impurity region 40 includes a plurality of linear impurity regions 41 arranged in stripes. A p-type impurity concentration in the impurity region 40 is, for example, $10 \times 10^{16}$ cm$^{-3}$ or more and $10 \times 10^{21}$ cm$^{-3}$ or less.

The linear impurity regions 41 are arranged at equal intervals in the second direction Y, and each linear impurity region 41 extends in the first direction X. The linear impurity regions 41 are integrated with the first guard region 31. Specifically, both end portions of the linear impurity regions 41 in the first direction X are connected to an inner end portion of the first guard region 31.

Referring to FIG. 4, a bottom portion of each linear impurity region 41 (a bottom portion 40a of the impurity region 40) is in contact with the epitaxial layer 7. The bottom portion of each linear impurity region 41 includes a pair of curved portions toward the second main surface 4 of the semiconductor layer 2 and a flat portion connecting the curved portions.

A width W of the linear impurity region 41 in the second direction Y is, for example, 0.5 μm or more and 10 μm or less. A depth D of the linear impurity region 41 is, for example, 0.3 μm or more and 1.5 μm or less. A pitch P of the plurality of linear impurity regions 41 in the second direction Y is, for example, 1.0 μm or more and 5 μm or less.

The first covering portion 18 of the Schottky portion 15 includes a first portion 18A directly connected to the epitaxial layer 7 and a second portion 18B directly connected to the impurity region 40. The first portion 18A is in contact with the epitaxial layer 7, and the second portion 18B is in contact with the impurity region 40. The Schottky junction SJ is formed in a vicinity of a contact interface between the first portion 18A and the epitaxial layer 7. Since the anode electrode 14 is formed by using at least one selected from the group consisting of the aluminum alloy and aluminum, the first portion 18A and the second portion 18B, which are portions of the anode electrode 14, are formed of the same substance. Therefore, the first portion 18A and the second portion 18B have the same composition.

According to the first embodiment, the Schottky barrier diode 1 is provided with both of the Schottky junction SJ and the pn junction PJ. Therefore, when a forward overcurrent is applied, a minority of carriers are injected into the epitaxial layer 7 from the pn junction PJ. As a result, a resistance of the epitaxial layer 7 is reduced, so that an amount of heat generated can be suppressed, thereby improving a surge resistance.

In addition, according to the first embodiment, the anode electrode 14 including the Schottky portion 15 forming the Schottky junction SJ with the semiconductor layer 2, as a portion thereof, is formed by using the aluminum alloy or aluminum. Therefore, a forward voltage can be reduced.

When the forward voltage is reduced, there is a concern that a leakage current in a reverse direction may increase. Therefore, the depth D of the impurity region 40 is set to be 0.3 μm or more and 1.5 μm or less and the pitch P of the impurity region 40 is set to be 1.0 μm or more and 5 μm or less, whereby an electric field strength generated in the Schottky junction SJ is sufficiently reduced and the leakage current can be sufficiently suppressed.

In addition, according to the first embodiment, the Schottky portion 15 and the connecting portion 16 form a single-layer structure with the same substance. Therefore, as described below, the Schottky portion 15 and the connecting portion 16 can be formed in the same process without changing the substance to be used. That is, a manufacturing method can be simplified as compared with a case where the Schottky portion 15 and the connecting portion 16 are formed of different substances.

Figure 6:
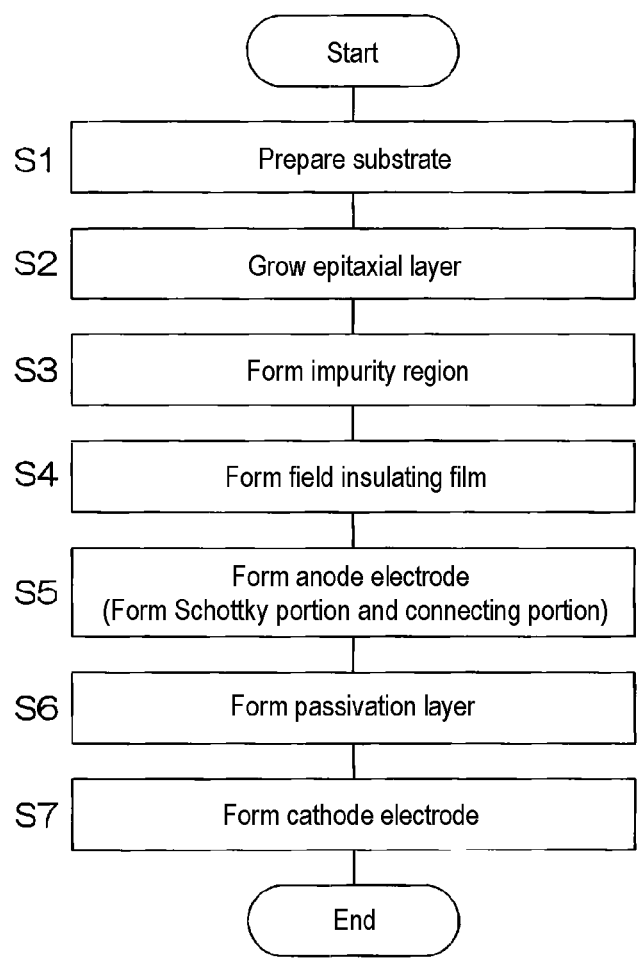
FIG. 6 is a flowchart of a method of manufacturing the Schottky barrier diode.

A method of manufacturing the Schottky barrier diode 1 is as follows. FIG. 6 is a flowchart for explaining an example of a method of manufacturing the Schottky barrier diode 1 shown in FIG. 1.

In manufacturing the Schottky barrier diode 1, first, the n-type semiconductor substrate 6 is prepared (step S1). Subsequently, the n-type epitaxial layer 7 grows from the semiconductor substrate 6 (step S2). As a result, the semiconductor layer 2 is formed.

Subsequently, the impurity region 40 is formed by, for example, injecting p-type impurities through an ion implantation mask (step S3). By injecting the p-type impurities, the guard region 30 is formed simultaneously with the impurity region 40. Then, the field insulating film 13 is formed on the surface 7a of the epitaxial layer 7 by, for example, a chemical vapor deposition (CVD) method (step S4). Subsequently, the anode electrode 14 is formed on the epitaxial layer 7 and the field insulating film 13 by, for example, a sputtering method (step S5). As a result, the Schottky portion 15 and the connecting portion 16 forming a single-layer structure are formed. Subsequently, the passivation layer 20 is formed on the anode electrode 14 by, for example, a CVD method (step S6). Finally, the cathode electrode 8 is formed over the entire second main surface 4 of the semiconductor layer 2 by, for example, a sputtering method (step S7).

Second Embodiment

Figure 7:
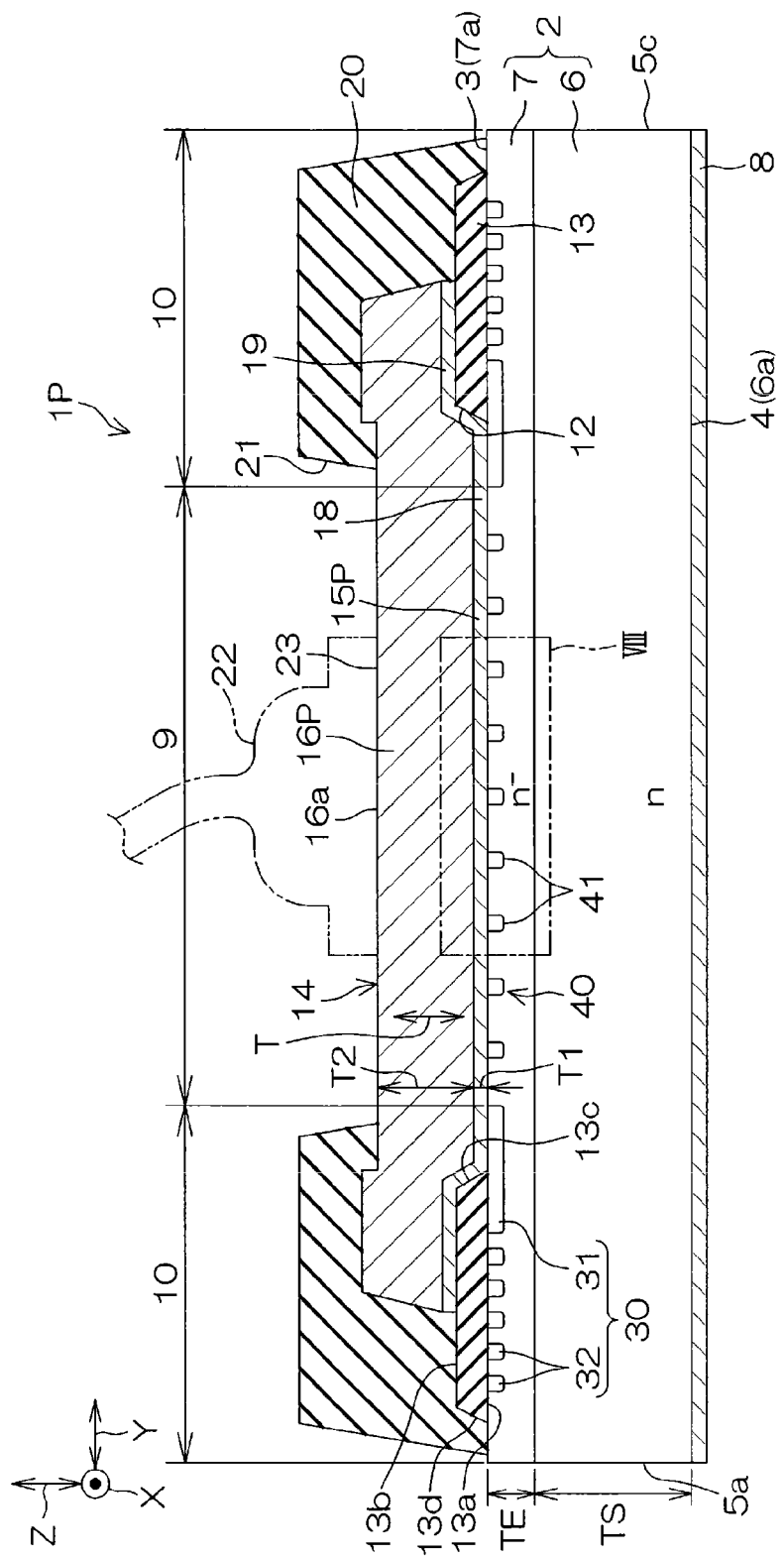
FIG. 7 is a cross-sectional view of a main part of a Schottky barrier diode according to a second embodiment.
Figure 8:
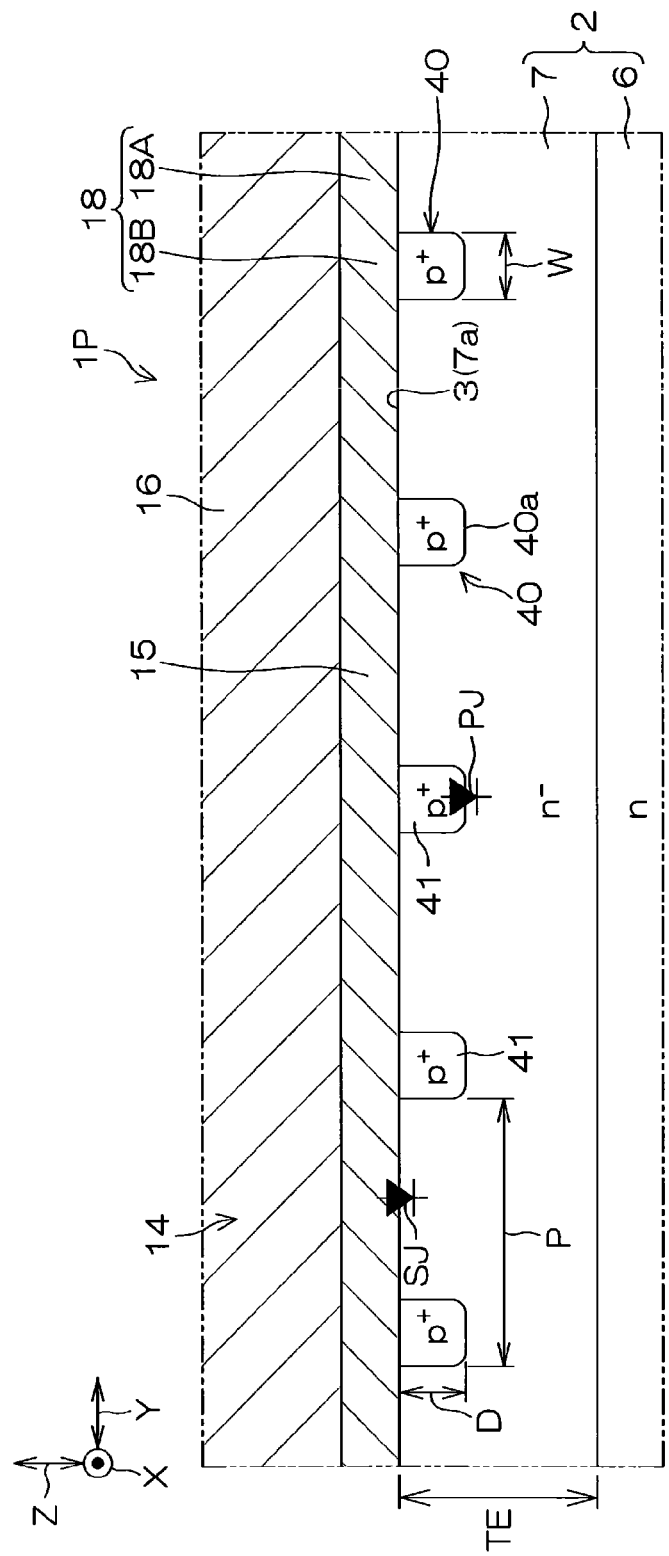
FIG. 8 is an enlarged view of region VIII shown in FIG. 7.

FIG. 7 is a cross-sectional view of a main part of a Schottky barrier diode 1P according to a second embodiment. FIG. 8 is an enlarged view of region VIII shown in FIG. 7. In FIGS. 7 and 8, the same configurations as those shown in FIGS. 1 to 6 described above are denoted by the same reference numerals as FIG. 1 and so on, and explanation thereof will be omitted (similar also in FIG. 9 to be described later).

Referring to FIGS. 7 and 8, the Schottky barrier diode 1P according to the second embodiment is mainly different from the Schottky barrier diode 1 according to the first embodiment in that the anode electrode 14 has a stacked structure. The anode electrode 14 according to the second embodiment has a Schottky portion 15P and a connecting portion 16P that form a stacked structure so as to be in contact with each other.

The Schottky portion 15P forms a Schottky junction SJ with the semiconductor layer 2 (the epitaxial layer 7). The Schottky portion 15P includes a first covering portion 18 and a second covering portion 19. The connecting portion 16P has a surface 16a to which the connecting member 22 is connected.

The Schottky portion 15P and the connecting portion 16P are formed of different substances from each other. Specifically, the Schottky portion 15P is formed of one kind of substance selected from aluminum, an AlSi alloy, an AlCu alloy, and an AlSiCu alloy, and the connecting portion 16P is formed of one kind of substance, which is different from the Schottky portion 15P, selected from aluminum, an AlSi alloy, an AlCu alloy, and an AlSiCu alloy. For example, the Schottky portion 15P may be formed of aluminum, and the connecting portion 16P may be formed of an AlCu alloy.

The first covering portion 18 of the Schottky portion 15P includes a first portion 18A directly connected to the epitaxial layer 7 and a second portion 18B directly connected to the impurity region 40. The first portion 18A is in contact with the epitaxial layer 7, and the second portion 18B is in contact with the impurity region 40. Since the Schottky portion 15P is formed by using at least one selected from the group consisting of an aluminum alloy and aluminum, the first portion 18A and the second portion 18B, which are portions of the Schottky portion 15P, are formed of the same substance. Therefore, the first portion 18A and the second portion 18B have the same composition.

A thickness T1 of the Schottky portion 15P is smaller than a thickness T2 of the connecting portion 16P. Therefore, it is possible to prevent the connecting member 22 from passing through the connecting portion 16P and reaching the Schottky portion 15P. For that purpose, it is desirable that the thickness T1 of the Schottky portion 15P is 50 nm or more and 500 nm or less.

According to the second embodiment, the same effects as those of the first embodiment are obtained. That is, since the Schottky barrier diode 1P is provided with both of the Schottky junction SJ and the pn junction PJ, the surge resistance is improved. Further, since the anode electrode 14 is formed of the aluminum alloy or aluminum, the forward voltage can be reduced.

According to the second embodiment, the Schottky portion 15P and the connecting portion 16P are formed of different substances from each other and form a stacked structure. Therefore, substances appropriate for respective roles of the Schottky portion 15P and the connecting portion 16P can be individually selected.

Figure 9:
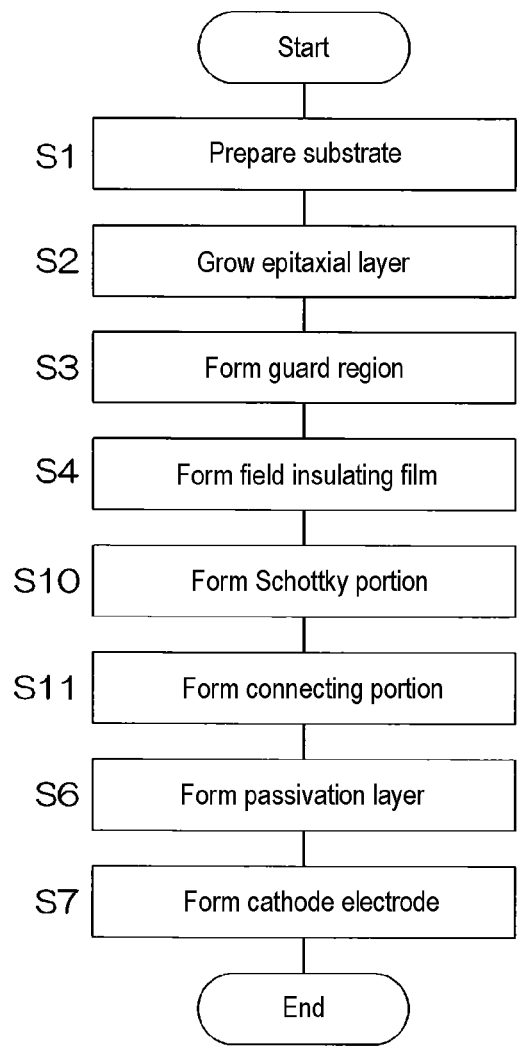
FIG. 9 is a flowchart of a method of manufacturing the Schottky barrier diode according to the second embodiment.

A method of manufacturing the Schottky barrier diode 1P is as follows. FIG. 9 is a flowchart for explaining an example of a method of manufacturing the Schottky barrier diode 1P shown in FIG. 7.

The main difference between the method of manufacturing the Schottky barrier diode 1P according to the second embodiment and the method of manufacturing the Schottky barrier diode 1 according to the first embodiment (see FIG. 6) is that the anode electrode 14 is formed stepwise.

Specifically, in the method of manufacturing the Schottky barrier diode 1P, after the field insulating film 13 is formed on the epitaxial layer 7 (step S4), the Schottky portion 15P is formed on the epitaxial layer 7 and the field insulating film 13 by, for example, a sputtering method (step S10). Thereafter, the connecting portion 16P is formed on the Schottky portion 15P by a sputtering method (step S11). By completing the formation of the Schottky portion 15P and the connecting portion 16P, the formation of the anode electrode 14 is completed. Thereafter, the passivation layer 20 and the cathode electrode 8 are sequentially formed in the same manner as in the method of manufacturing the Schottky barrier diode 1 according to the first embodiment.

Third Embodiment

Figure 10:
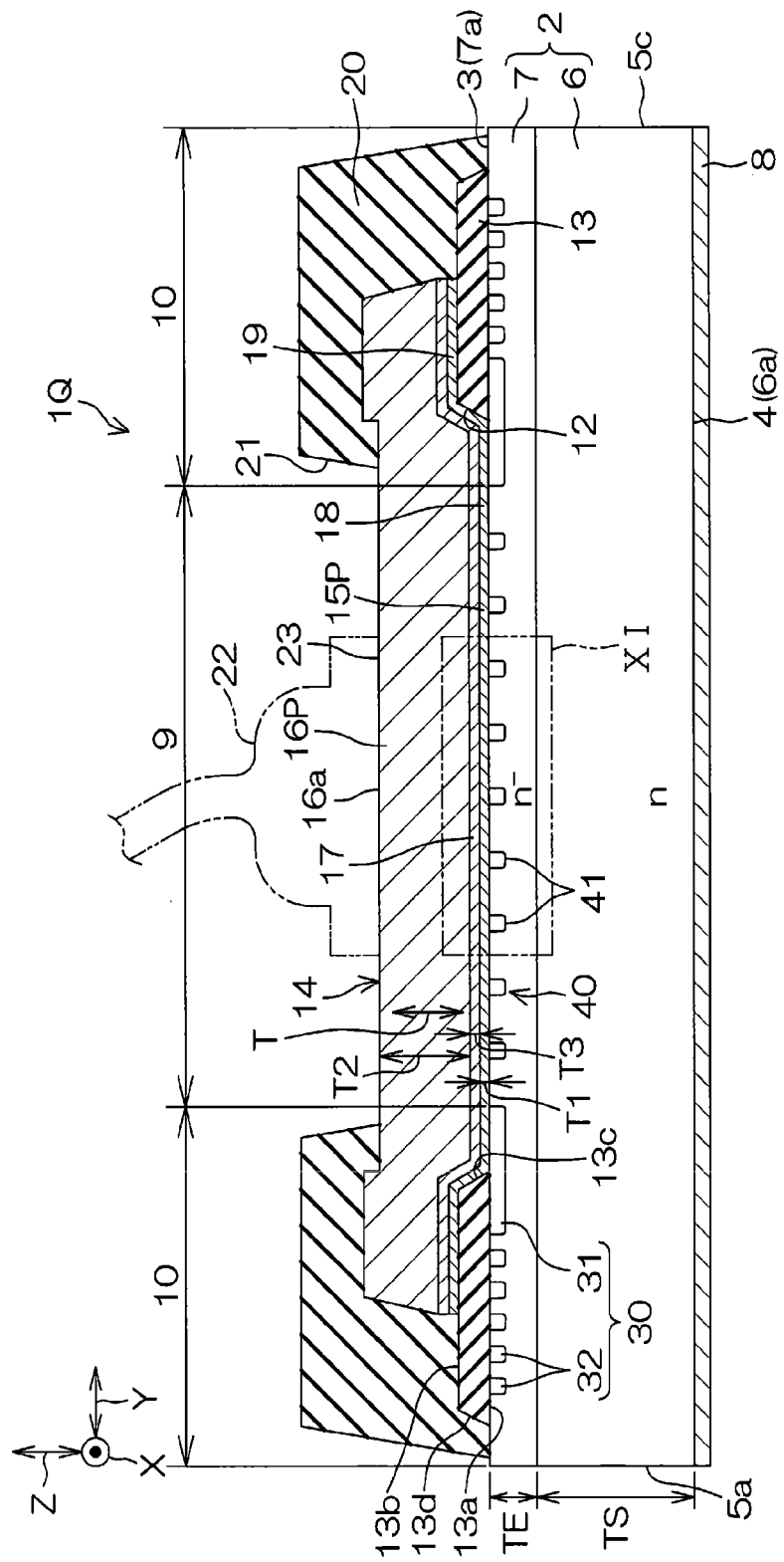
FIG. 10 is a cross-sectional view of a main part of a Schottky barrier diode according to a third embodiment.
Figure 11:
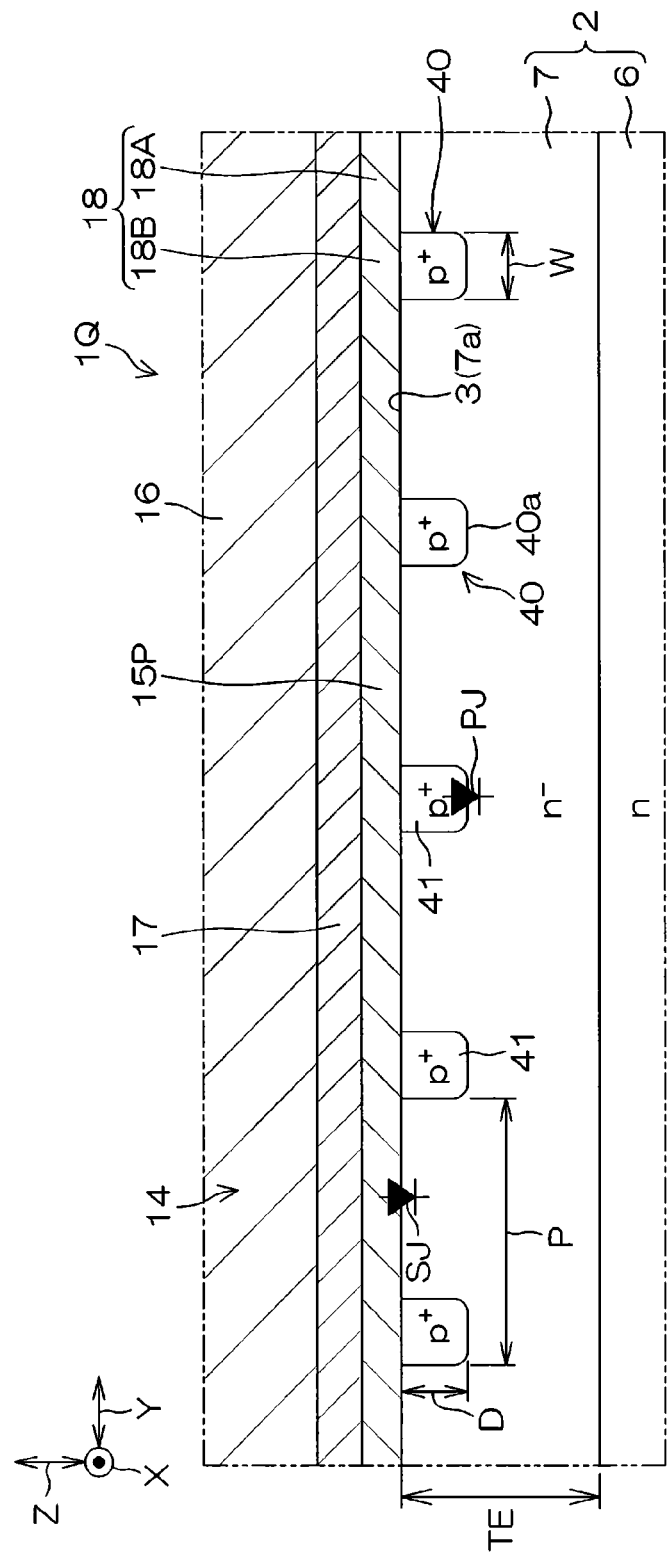
FIG. 11 is an enlarged view of region XI shown in FIG. 10.

FIG. 10 is a cross-sectional view of a main part of a Schottky barrier diode 1Q according to a third embodiment. FIG. 11 is an enlarged view of region XI shown in FIG. 10. In FIGS. 10 and 11, the same configurations as those shown in FIGS. 1 to 9 described above are denoted by the same reference numerals as FIG. 1 and so on, and explanation thereof will be omitted (similar also in FIG. 12 to be described later).

The main difference between the Schottky barrier diode 1Q according to the third embodiment and the Schottky barrier diode 1P according to the second embodiment (see FIG. 7) is that the anode electrode 14 further includes a barrier portion 17 located between the Schottky portion 15P and the connecting portion 16P.

Referring to FIGS. 10 and 11, it is desirable that the barrier portion 17 is formed of a chemically stable substance as compared with the Schottky portion 15P. The barrier portion 17 is formed of, for example, at least one selected from the group consisting of titanium (Ti) and titanium nitride (TiN). The Schottky portion 15P, the barrier portion 17, and the connecting portion 16P form a stacked structure in which they are stacked in this order from a side of the epitaxial layer 7.

In the example of FIG. 10, the Schottky portion 15P and the connecting portion 16P are separated by the barrier portion 17 so as not to come into contact with each other.

Unlike the second embodiment, the Schottky portion 15P and the connecting portion 16P according to the third embodiment may be formed of the same substance or may be formed of different substances. For example, the Schottky portion 15P may be formed of aluminum while the connecting portion 16P may be formed of an AlCu alloy, or both of the Schottky portion 15P and the connecting portion 16P may be formed of aluminum.

According to the third embodiment, the same effects as those of the first embodiment are obtained. That is, since the Schottky barrier diode 1Q is provided with both of the Schottky junction SJ and the pn junction PJ, the surge resistance is improved. In addition, since the anode electrode 14 is formed of the aluminum alloy or aluminum, the forward voltage can be reduced.

According to the third embodiment, the barrier portion 17 is located between the Schottky portion 15P and the connecting portion 16P. Therefore, it is possible to prevent a substance contained in the connecting portion 16P from diffusing into the Schottky portion 15P to change the composition of the Schottky portion 15P. As a result, it is possible to suppress a change in Schottky barrier due to the change in composition of the Schottky portion 15P.

The substance diffused in the Schottky portion 15P includes at least one selected from the group consisting of a substance contained in the connecting portion 16P (for example, copper in the AlCu alloy) in order to exhibit the function as the connecting portion 16P, and a substance (for example, oxygen) diffused into the connecting portion 16P from the connecting member 22.

As in the example of FIG. 10, when the Schottky portion 15P and the connecting portion 16P are separated from each other by the barrier portion 17 so as not to come into contact with each other, it is possible to further suppress the substance from being diffused from the connecting portion 16P into the Schottky portion 15P.

In a configuration in which the barrier portion 17 is located between the Schottky portion 15P and the connecting portion 16P, unlike the example shown in FIG. 10, the Schottky portion 15P and the connecting portion 16P may not be separated from each other in the entire region, but may be partially in contact with each other.

According to the third embodiment, the Schottky portion 15P and the connecting portion 16P are formed of different substances from each other and form a stacked structure. Therefore, substances appropriate for respective roles of the Schottky portion 15P and the connecting portion 16P can be individually selected.

Figure 12:
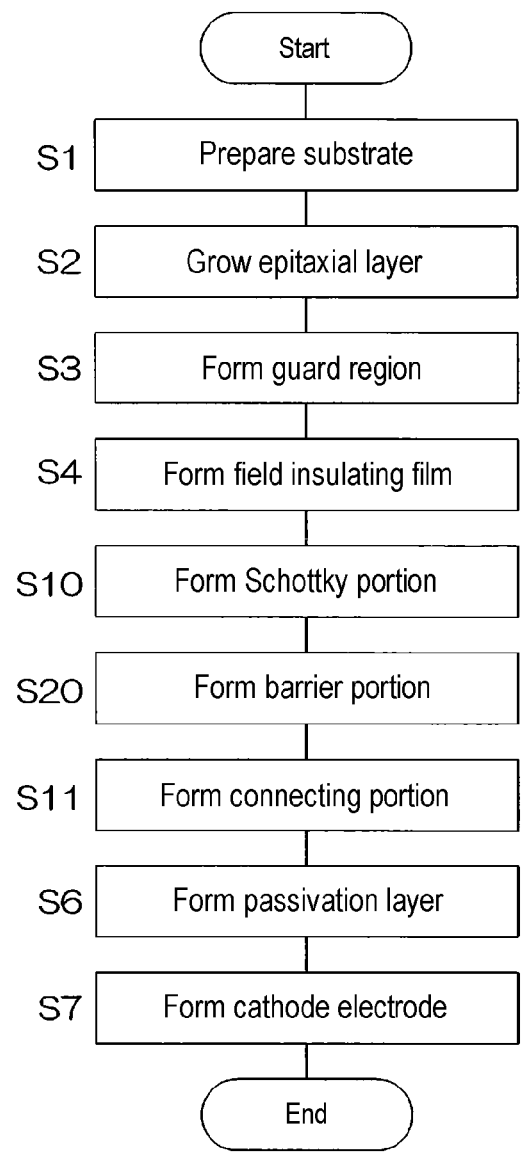
FIG. 12 is a flowchart of a method of manufacturing the Schottky barrier diode according to the third embodiment.

A method of manufacturing the Schottky barrier diode 1Q is as follows. FIG. 12 is a flowchart for explaining an example of a method of manufacturing the Schottky barrier diode 1Q shown in FIG. 10. The main difference between the method of manufacturing the Schottky barrier diode 1Q according to the third embodiment and the method of manufacturing the Schottky barrier diode 1P according to the second embodiment (see FIG. 9) is that the formation of the barrier portion 17 (step S20) is executed between the formation of the Schottky portion 15P (step S10) and the formation of the connecting portion 16P (step S11).

The barrier portion 17 is formed on the Schottky portion 15P by, for example, a CVD method (step S20). Subsequently, the connecting portion 16P is formed on the barrier portion 17 by, for example, a sputtering method (step S11). By completing the formation of the Schottky portion 15P, the barrier portion 17, and the connecting portion 16P, the formation of the anode electrode 14 is completed. Thereafter, the passivation layer 20 and the cathode electrode 8 are sequentially formed in the same manner as in the method of manufacturing the Schottky barrier diode 1P according to the second embodiment.

Fourth Embodiment

Figure 13:
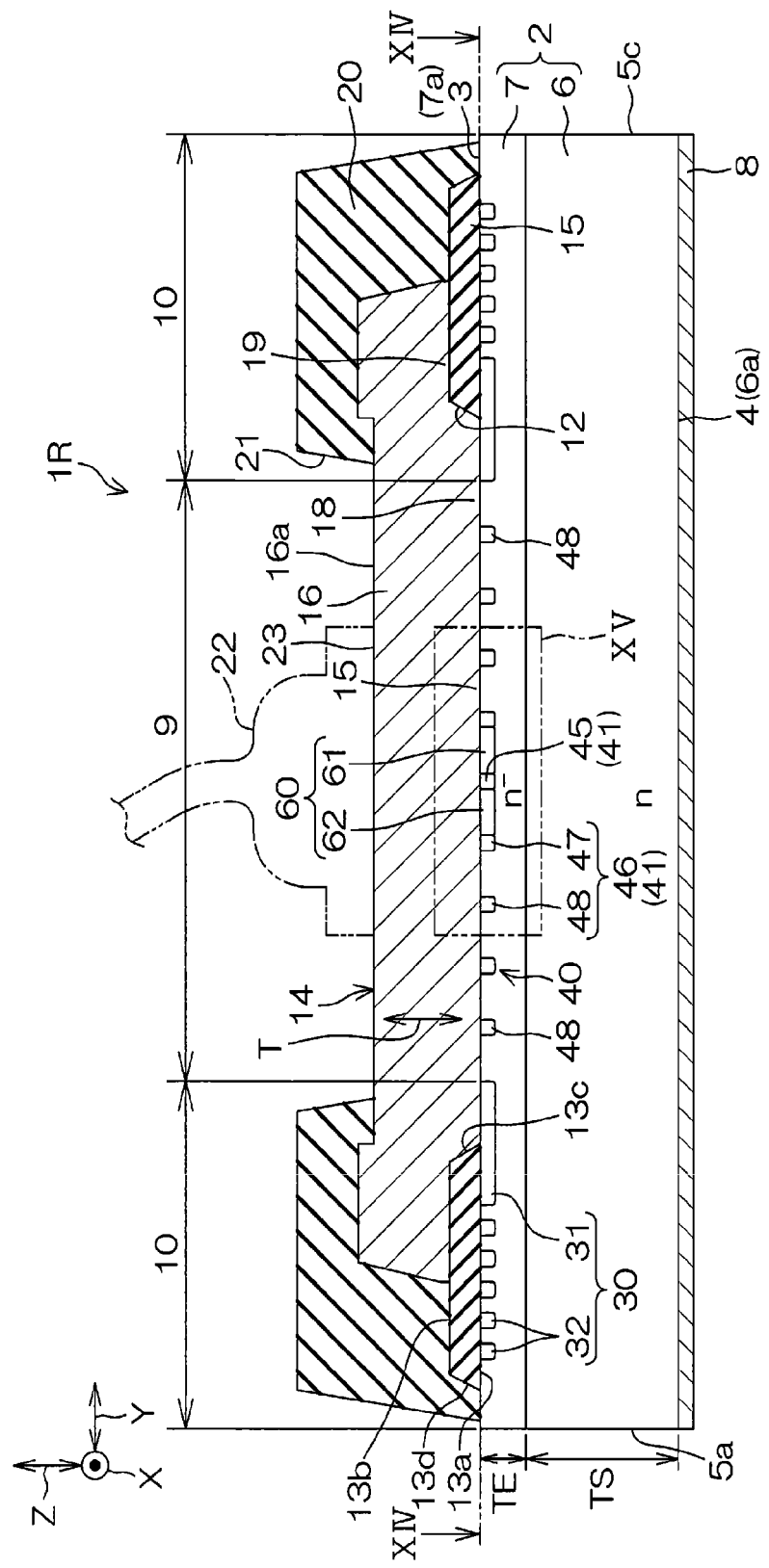
FIG. 13 is a cross-sectional view of a main part of a Schottky barrier diode according to a fourth embodiment.
Figure 14:
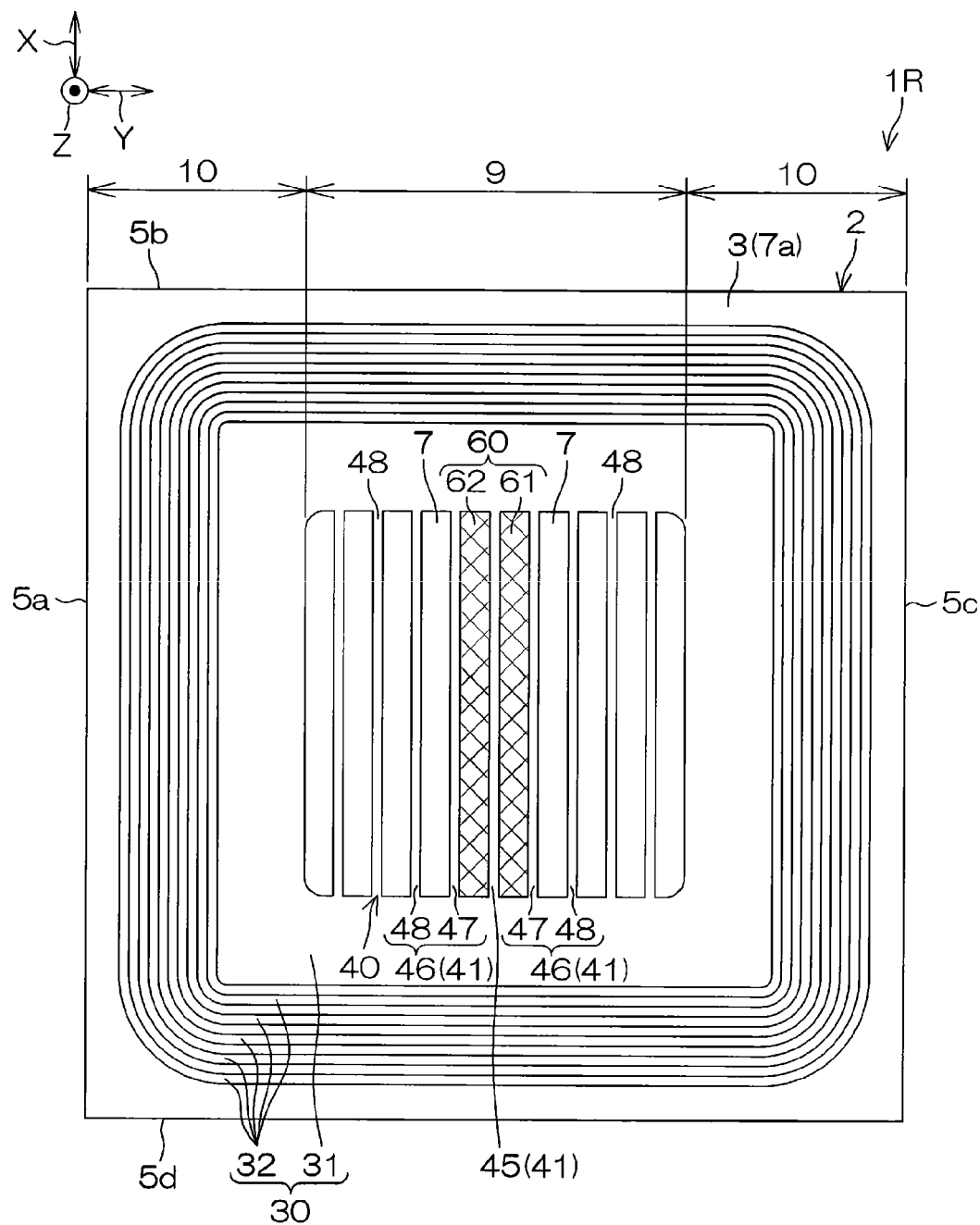
FIG. 14 is a cross-sectional view taken along line XIV-XIV shown in FIG. 13.
Figure 15:
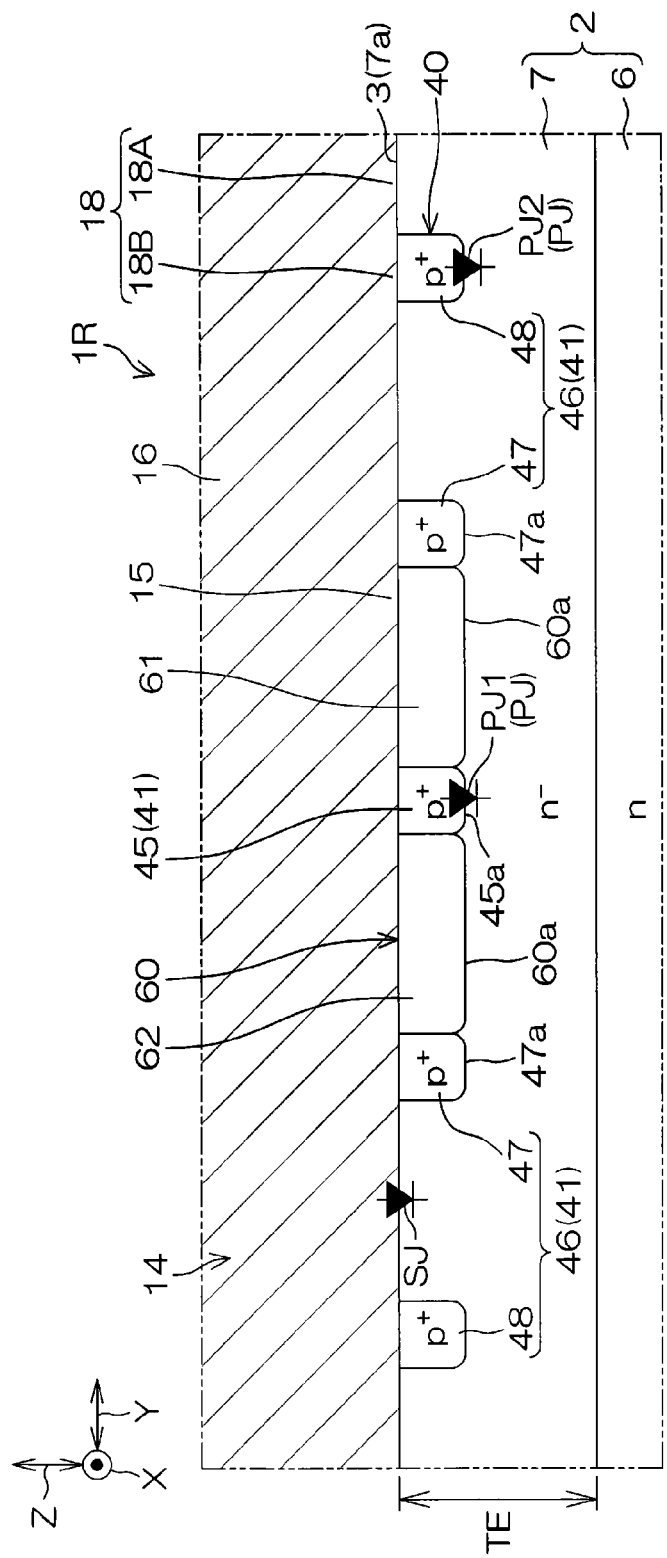
FIG. 15 is an enlarged view of region XV shown in FIG. 13.

FIG. 13 is a cross-sectional view of a main part of a Schottky barrier diode 1R according to a fourth embodiment. FIG. 14 is a cross-sectional view taken along line XIV-XIV shown in FIG. 11. FIG. 15 is an enlarged view of region XV shown in FIG. 13.

The main difference between the Schottky barrier diode 1R according to the fourth embodiment and the Schottky barrier diode 1 according to the first embodiment (see FIG. 2) is that a lattice defect region 60 is formed in the surface layer portion of the surface 7a of the epitaxial layer 7.

Referring to FIGS. 13 to 15, the lattice defect region 60 is a region having more lattice defects than the epitaxial layer 7. The lattice defect region 60 is a region formed by injecting atoms of a rare gas such as argon (Ar) into the epitaxial layer 7. Therefore, the lattice defect region 60 is also referred to as a rare gas-containing region. An impurity concentration in the lattice defect region 60 is, for example, $10 \times 10^{19}$ cm$^{-3}$ or more and $10 \times 10^{21}$ cm$^{-3}$ or less.

The lattice defect region 60 is in contact with the Schottky portion 15. When the rare gas atoms are injected into the epitaxial layer 7, crystal lattices of SiC constituting the epitaxial layer 7 are destroyed to generate lattice defects. Therefore, although the lattice defect region 60 is in contact with the Schottky portion 15, it does not form a Schottky junction with the Schottky portion 15 and inhibits a current flow from the Schottky portion 15 to the epitaxial layer 7a. In other words, since the lattice defect region 60 has more lattice defects than the epitaxial layer 7, the lattice defect region 60 is a high resistance layer having a higher resistance than the epitaxial layer 7.

The lattice defect region 60 is provided around one of the plurality of linear impurity regions 41.

Specifically, the impurity region 40 includes an inner impurity region 45 arranged inside the lattice defect region 60 so as to be in contact with the lattice defect region 60, and an outer impurity region 46 arranged outside the lattice defect region 60. Further, among the plurality of linear impurity regions 41, the linear impurity region 41 located inside the lattice defect region 60 functions as the inner impurity region 45, and among the plurality of linear impurity regions 41, the linear impurity regions 41 located outside the lattice defect region 60 function as the outer impurity region 46. The inner impurity region 45 is sandwiched by the lattice defect region 60 from both sides thereof in the second direction Y.

The outer impurity region 46 includes a pair of outer contact impurity regions 47 arranged on the opposite side of the inner impurity region 45, with the lattice defect region 60 interposed therebetween, so as to be in contact with the lattice defect region 60, and a plurality of outer separation impurity regions 48 arranged on the opposite side of the inner impurity region 45, with the lattice defect region 60 interposed therebetween, so as to be separated from the lattice defect region 60.

The lattice defect region 60 is in contact with the inner impurity region 45 from both sides thereof in the second direction Y. In the example of FIG. 14, both end portions of the lattice defect region 60 in the first direction X are in contact with the inner end of the first guard region 31. Unlike the example of FIG. 14, both end portions of the lattice defect region 60 in the first direction X may not be in contact with the inner end of the first guard region 31, but may face the first guard region 31 via the epitaxial layer 7.

The lattice defect region 60 includes a first lattice defect region 61, which extends linearly in the first direction X and is in contact with the inner impurity region 45 from one side thereof in the second direction Y, and a second lattice defect region 62 which extends linearly in the first direction X and is in contact with the inner impurity region 45 from the other side thereof in the second direction Y.

The outer contact impurity region 47 on one side in the second direction Y is sandwiched between the first lattice defect region 61 and the epitaxial layer 7 in a plan view. The outer contact impurity region 47 on the other side in the second direction Y is sandwiched between the second lattice defect region 62 and the epitaxial layer 7 in a plan view.

Each bottom portion 60a of the lattice defect region 60 includes a pair of curved portions toward the semiconductor substrate 6 and a flat portion connecting the curved portions. The flat portion of each bottom portion 60a of the lattice defect region 60 is formed flush with a flat portion of a bottom portion 45a of the inner impurity region 45 and a flat portion of a bottom portion 47a of each outer contact impurity region 47.

Unlike the example shown in FIG. 15, the flat portion of each bottom portion 60a of the lattice defect region 60 may be located closer to the first main surface 3 than the flat portion of the bottom portion 45a of the inner impurity region 45 and the flat portion of the bottom portion 47a of each outer contact impurity region 47. Conversely, the flat portion of the bottom portion 60a of the lattice defect region 60 may be located closer to the second main surface 4 than the flat portion of the bottom portion 45a of the inner impurity region 45 and the flat portion of the bottom portion 47a of each outer contact impurity region 47.

According to the fourth embodiment, the same effects as those of the first embodiment are obtained. That is, since the Schottky barrier diode 1R is provided with both of the Schottky junction SJ and the pn junction PJ, the surge resistance is improved. In addition, since the anode electrode 14 is formed of the aluminum alloy or aluminum, the forward voltage can be reduced.

Figure 16A:
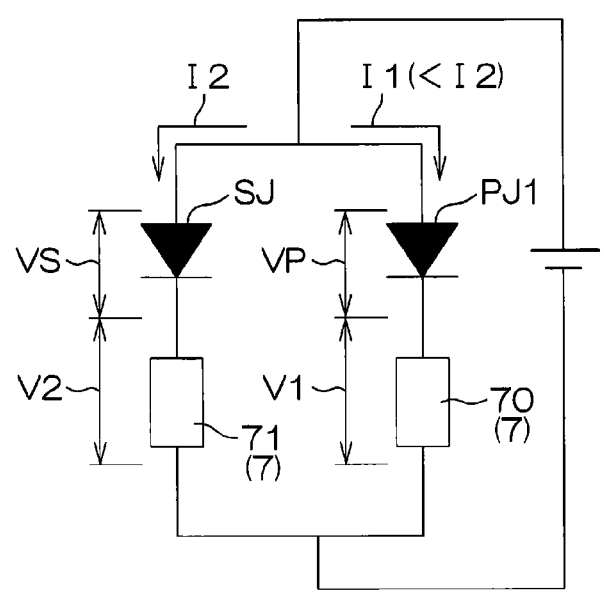
FIG. 16A is a circuit diagram for explaining a voltage drop around an inner impurity region included in the Schottky barrier diode according to the fourth embodiment.

Here, in a configuration in which the lattice defect region 60 is not provided as in the Schottky barrier diode 1 according to the first embodiment, when the thickness TE of the epitaxial layer 7 is large, a voltage drop due to the epitaxial layer 7 becomes large and a voltage applied to the pn junction PJ becomes small. Thus, by providing the lattice defect region 60 as in the fourth embodiment, it is possible to suppress a current I1 flowing in the lattice defect region 60 and make the current I1 smaller than a current I2 flowing in the Schottky junction SJ. As a result, as shown in FIG. 16A, a voltage drop V1 due to a first vicinity portion 70 located in a vicinity of the lattice defect region 60 in the epitaxial layer 7 is reduced and becomes smaller than a voltage drop V2 due to a second vicinity portion 71 located in a vicinity of the Schottky junction SJ in the epitaxial layer 7.

Therefore, a voltage drop in a portion of the epitaxial layer 7 located in a vicinity of the inner impurity region 45 also becomes small as in the voltage drop V1 due to the first vicinity portion 70. Thus, it is possible to make a potential difference VP applied to a pn junction PJ1 formed between the inner impurity region 45 and the epitaxial layer 7 larger than a potential difference VS applied to the Schottky junction SJ. As a result, it is possible to sufficiently secure the potential difference VP applied to the pn junction PJ1 formed between the inner impurity region 45 and the epitaxial layer 7. Therefore, the surge resistance can be improved.

Figure 16B:
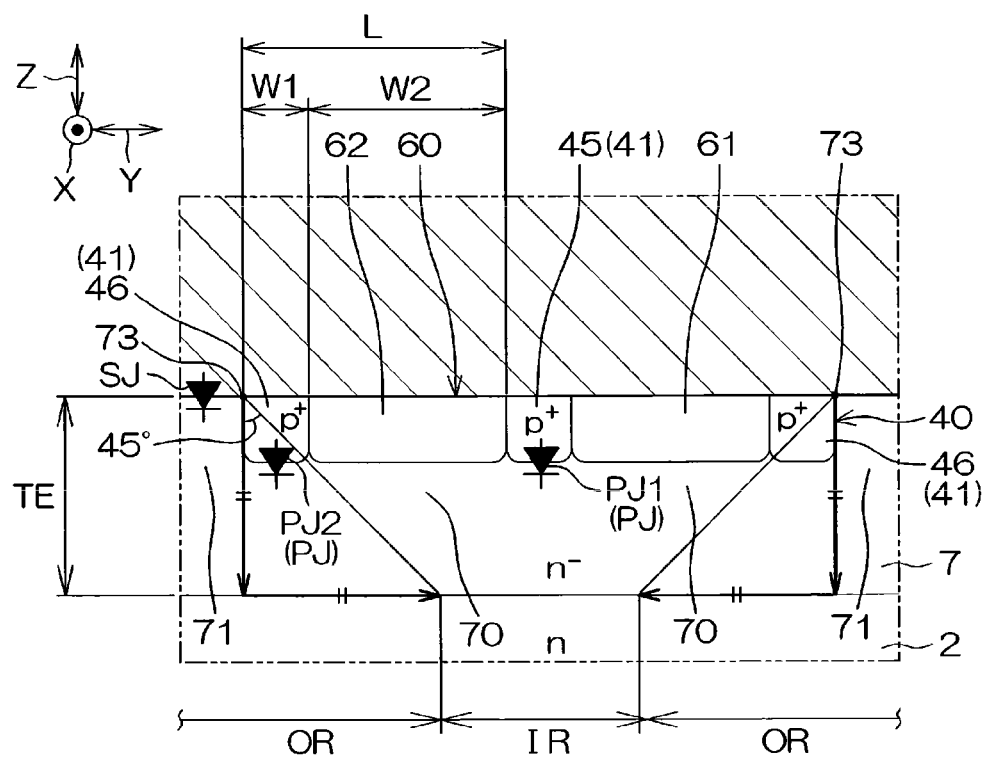
FIG. 16B is a cross-sectional view for explaining the voltage drop around the inner impurity region.

As shown in FIG. 16B, when a distance L between the Schottky junction SJ and the inner impurity region 45 is larger than the thickness TE of the epitaxial layer 7, it is possible to further suppress the current flowing in a portion of the epitaxial layer 7 located between the inner impurity region 45 and the semiconductor substrate 6.

The distance L between the Schottky junction SJ and the inner impurity region 45 corresponds to a sum of a width W1 of the outer contact impurity region 47 and a width W2 of the first lattice defect region 61 (a width of the second lattice defect region 62).

A region inward of a position obtained by moving from a boundary 73 between the Schottky junction SJ and a pn junction PJ2, which is formed between the outer contact impurity region 47 and the epitaxial layer 7, toward the inner impurity region 45 by the same width as the thickness TE of the epitaxial layer 7 is referred to as an inner region IR, and a region outward of the inner region IR is referred to as an outer region OR. In the inner region IR, a current flowing through the epitaxial layer 7 is effectively suppressed by the lattice defect region 60. When the distance L between the Schottky junction SJ and the inner impurity region 45 is larger than the thickness TE of the epitaxial layer 7, the inner region IR is set in the epitaxial layer 7. In other words, when the distance L between the Schottky junction SJ and the inner impurity region 45 is larger than the thickness TE of the epitaxial layer 7, the first vicinity portion 70 is located in the inner region IR.

Figure 17:
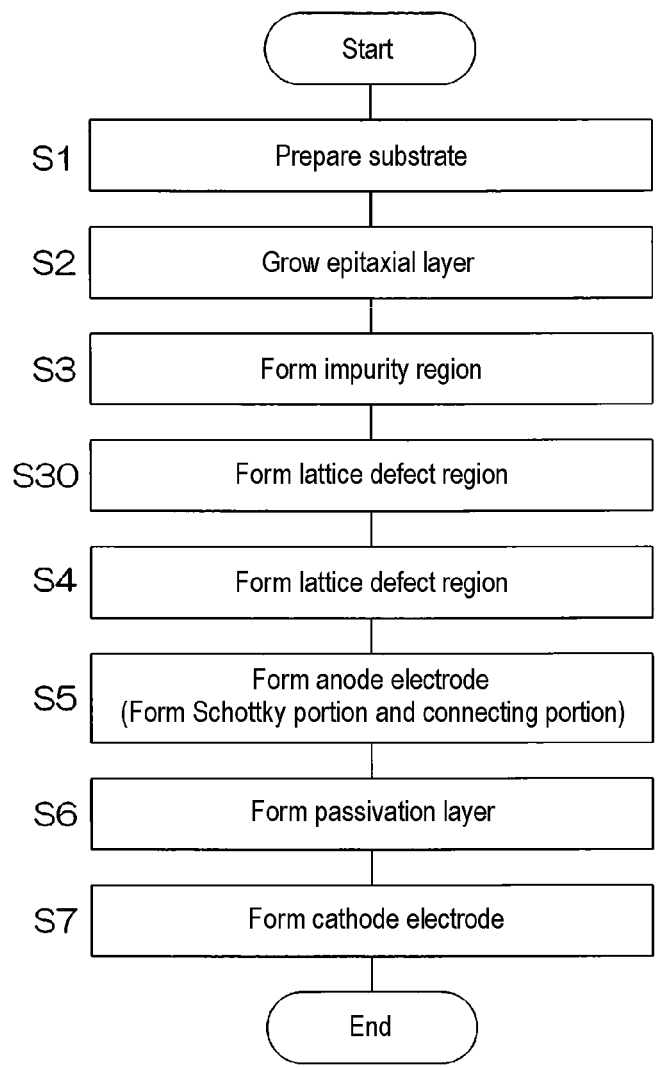
FIG. 17 is a flowchart of a method of manufacturing the Schottky barrier diode according to the fourth embodiment.

Next, a method of manufacturing the Schottky barrier diode 1R according to the fourth embodiment will be described. FIG. 17 is a flowchart of the method of manufacturing the Schottky barrier diode 1R according to the fourth embodiment.

The method of manufacturing the Schottky barrier diode 1R is different from the method of manufacturing the Schottky barrier diode 1 according to the first embodiment in that the lattice defect region 60 is formed (step S30) after the impurity region 40 is formed (after step S3). Thereafter, the field insulating film 13, the anode electrode 14, the passivation layer 20, and the cathode electrode 8 are sequentially formed.

Figure 18A:
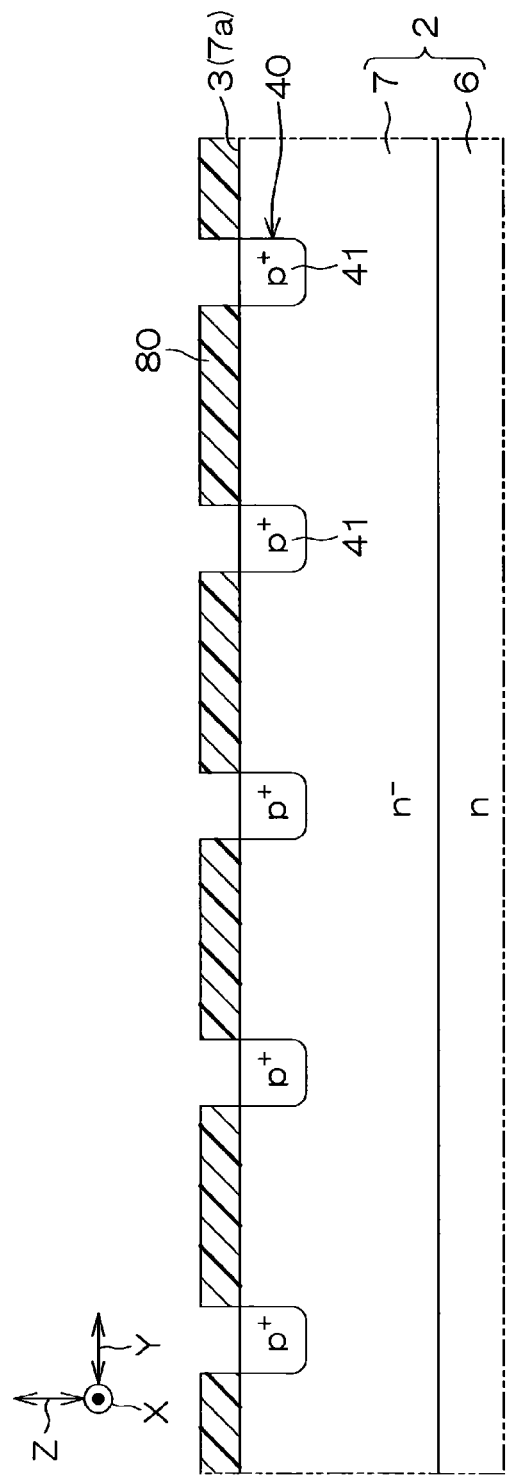
FIG. 18A is a schematic view for explaining how an impurity region and a lattice defect region are formed in the method of manufacturing the Schottky barrier diode according to the fourth embodiment.
Figure 18B:
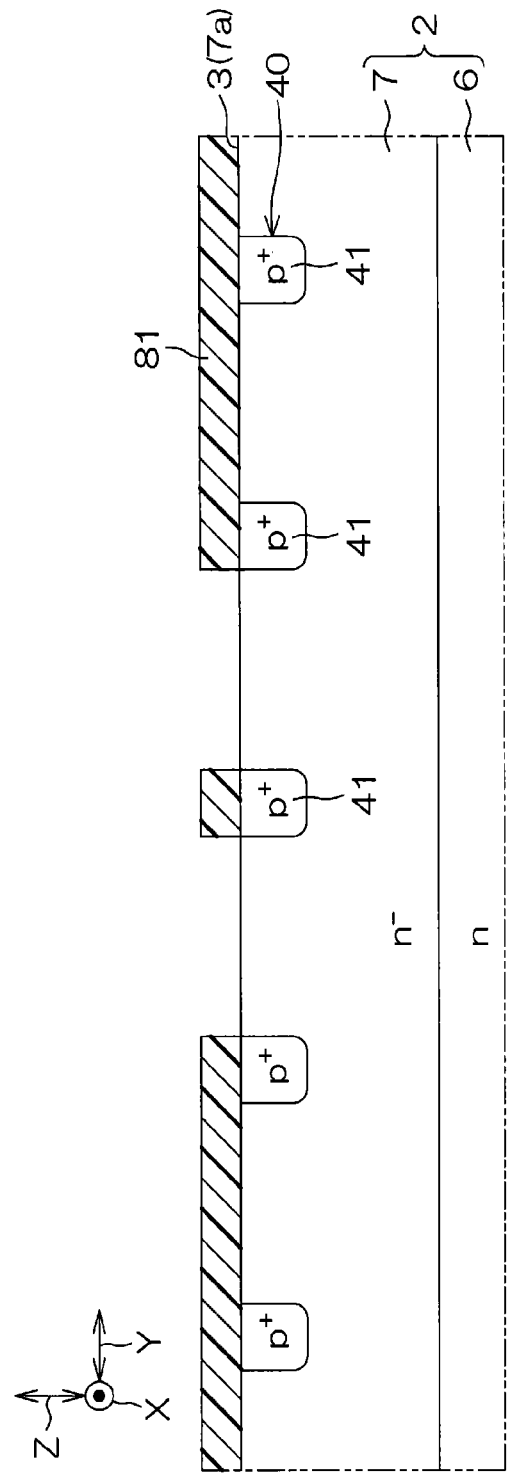
FIG. 18B is a schematic view for explaining how the impurity region and the lattice defect region are formed.

Next, how the impurity region 40 and the lattice defect region 60 are formed will be described in detail. FIGS. 18A to 18C are schematic views for explaining how the impurity region 40 and the lattice defect region 60 are formed.

As shown in FIG. 18A, after the epitaxial layer 7 is grown (after step S2), a resist mask 80 having a predetermined pattern is formed on the epitaxial layer 7. By introducing p-type impurities into a portion in the surface layer of the surface 7a of the epitaxial layer 7, which is not covered with the resist mask 80, by an ion implantation method, the impurity region 40 (the plurality of linear impurity regions 41) is formed together with the guard region 30 (step S3). Thereafter, the resist mask 80 is removed.

After the resist mask 80 is removed, as shown in FIG. 18B, a resist mask 81 having a pattern that exposes a region where the lattice defect region 60 is to be formed and covers the other regions is formed on the epitaxial layer 7.

Specifically, the resist mask 81 exposes both sides of the linear impurity region 41, which is the base of the inner impurity region 45, on the surface layer portion of the surface 7a of the epitaxial layer 7. Subsequently, as shown in FIG. 18C, by introducing the rare gas atoms into a portion in the surface layer of the surface 7a of the epitaxial layer 7, which is not covered with the resist mask 81, by an ion implantation method, the lattice defect region 60 is formed on both sides of the linear impurity region 41 which is the base of the inner impurity region 45 (step S30). By forming the lattice defect region 60, the linear impurity region 41 becomes the inner impurity region 45.

Thereafter, the resist mask 81 is removed, and the field insulating film 13 is formed on the epitaxial layer 7 (step S4).

Other Embodiments

For example, also in the second embodiment and the third embodiment, the lattice defect region 60 can be provided as in the fourth embodiment.

In addition, in each of the above-described embodiments, the impurity region 40 is composed of the plurality of linear impurity regions 41. However, the impurity region 40 may be formed in a mesh pattern so as to partition the epitaxial layer 7 in the form of a matrix in a plan view.

In the Schottky barrier diodes 1, 1P, 1Q, and 1R of the above-described embodiments, the semiconductor substrate 6 and the epitaxial layer 7 are made of n-type SiC, and the impurity region 40 is a p-type impurity region. However, unlike the above-described embodiments, the semiconductor substrate 6 and the epitaxial layer 7 may be made of p-type SiC, and the impurity region 40 may be an n-type impurity region.

In addition, in the second embodiment, the Schottky portion 15 and the connecting portion 16 are formed of different substances from each other, and are stacked to form a stacked structure. However, even when the Schottky portion 15 and the connecting portion 16 are formed of the same substance, the Schottky portion 15 and the connecting portion 16 form a stacked structure when they can form different layers from each other.

In each of the above-described embodiments, the first portion 18A and the second portion 18B were described as having the same composition, but they may not necessarily have completely the same composition and may have almost the same composition. The expression "almost the same composition" means that 95% or more of the composition is the same.

According to the present disclosure in some embodiments, it is possible to form a surface electrode including, as a part thereof, a Schottky portion forming a Schottky junction with a semiconductor substrate by using at least one selected from the group consisting of an Al alloy and Al. Therefore, it is possible to reduce a forward voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a semiconductor layer including a semiconductor substrate and an epitaxial layer of a first conductivity type formed on the semiconductor substrate;
   a surface electrode containing at least one selected from the group consisting of an aluminum alloy and aluminum and formed on the semiconductor layer, and including a connecting portion having a surface to which a connecting member is connected from a thickness direction of the surface electrode;
   an impurity region of a second conductivity type formed on a surface layer portion of the epitaxial layer and forming a pn junction with the epitaxial layer; and
   an insulating layer covering a portion of the surface electrode so as to form an opening that exposes a portion of the surface of the connecting portion as a connecting region with the connecting member,
   wherein the surface electrode includes a Schottky portion that is in contact with a surface of the semiconductor layer and forms a Schottky junction with the epitaxial layer.

2. The semiconductor device of claim 1, wherein the Schottky portion includes a first portion directly connected to the epitaxial layer and a second portion directly connected to the impurity region, and
   wherein the first portion and the second portion have the same composition.

3. The semiconductor device of claim 1, wherein the Schottky portion and the connecting portion form a single-layer structure formed of the same substance.

4. The semiconductor device of claim 1, wherein the Schottky portion and the connecting portion form a stacked structure.

5. The semiconductor device of claim 4, wherein the Schottky portion and the connecting portion are formed of different substances and are in contact with each other.

6. The semiconductor device of claim 4, wherein the surface electrode further includes a barrier portion located between the Schottky portion and the connecting portion.

7. The semiconductor device of claim 6, wherein the barrier portion is formed by using at least one selected from the group consisting of titanium and titanium nitride.

8. The semiconductor device of claim 4, wherein a thickness of the connecting portion is larger than a thickness of the Schottky portion.

9. The semiconductor device of claim 1, wherein the aluminum alloy is one of an AlSi alloy, an AlCu alloy, and an AlSiCu alloy.

10. The semiconductor device of claim 1, further comprising an interlayer insulating film arranged between the surface of the semiconductor layer and the Schottky portion,
    wherein the Schottky portion includes a first covering portion covering the surface of the semiconductor layer and a second covering portion covering the interlayer insulating film.

11. The semiconductor device of claim 1, further comprising a lattice defect region formed on the surface layer portion of the epitaxial layer so as to be in contact with the Schottky portion, and having more lattice defects than the epitaxial layer,
    wherein the impurity region includes an inner impurity region arranged inside the lattice defect region so as to be in contact with the lattice defect region.

12. The semiconductor device of claim 1, further comprising an annular guard region of the second conductivity type formed on the surface layer portion of the epitaxial layer.

13. The semiconductor device of claim 12, wherein the guard region includes a first guard region, and a plurality of second guard regions that surround the first guard region and are narrower than the first guard region.

14. The semiconductor device of claim 1, wherein the first conductivity type is n-type and the second conductivity type is p-type.

\* \* \* \* \*